United States Patent [19]

Childs

[11] 4,368,587
[45] Jan. 18, 1983

[54] METHOD OF MAKING COLOR SEPARATION PLATES USED AS A PROOF AND A POSITIVE FOR MAKING OFFSET PRINTING PLATES PHOTOGRAPHICALLY

[76] Inventor: Bernard Childs, 4, Rue de l'Université, 75007 Paris, France

[21] Appl. No.: 225,381

[22] Filed: Jan. 15, 1981

Related U.S. Application Data

[63] Continuation of Ser. No. 31,938, Apr. 20, 1979, abandoned, which is a continuation of Ser. No. 783,748, Apr. 1, 1977, abandoned.

[51] Int. Cl.³ .................. G09F 19/00; B05D 3/00; G03B 27/02; B41M 1/14
[52] U.S. Cl. .................................... 40/615; 427/271; 427/270; 434/81; 428/38; 101/150; 101/401.1; 430/307; 355/79; 352/234
[58] Field of Search ............ 40/615, 616, 427, 158 R; 101/150, 401.1; 282/28 R, 27.5; 400/120, 134.4, 134.5; 427/264, 270, 271; 434/81, 84, 87; 219/227, 229; 428/38, 37, 13; 352/234, 240, 38, 52; 355/79; 156/658, 659.1; 430/22, 536, 307

[56] References Cited

U.S. PATENT DOCUMENTS

| | | | |
|---|---|---|---|
| 302,226 | 7/1884 | Barnard | 101/401.1 |
| 799,609 | 12/1905 | Ludwig | 273/157 A |
| 1,250,713 | 12/1917 | Thornton | 352/234 |
| 1,614,924 | 1/1927 | Hutchison | 430/307 |
| 2,293,696 | 8/1942 | Burchell | 272/8 R |
| 3,264,106 | 8/1966 | Alldis | 355/79 |
| 3,661,575 | 5/1972 | Ketley et al. | 430/307 |
| 3,683,779 | 8/1972 | Lifton | 355/79 |
| 3,705,762 | 12/1972 | Ladd et al. | 352/50 |
| 3,913,477 | 10/1975 | Howland et al. | 430/307 |
| 4,038,078 | 7/1977 | Sukurai et al. | 427/271 |

FOREIGN PATENT DOCUMENTS

867877 5/1961 United Kingdom .................. 428/38

Primary Examiner—Gene Mancene
Assistant Examiner—Michael J. Foycik
Attorney, Agent, or Firm—Robert E. Burns; Emmanuel J. Lobato; Bruce L. Adams

[57] ABSTRACT

According to this process, a plurality of translucent monochrome supports of different colors are prepared. Each support is constituted by a transparent film coated on one side with a coloring matter. Then an elementary pattern is made by a selective scraping with a tool. By superimposing the engraved monochrome supports a final image is obtained by transparency which is the synthesis of the elementary patterns. The process lends itself particularly well to three-color or four-color printing.

3 Claims, 13 Drawing Figures

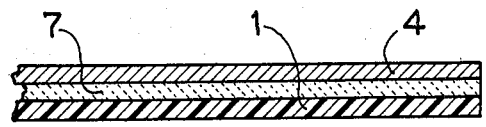
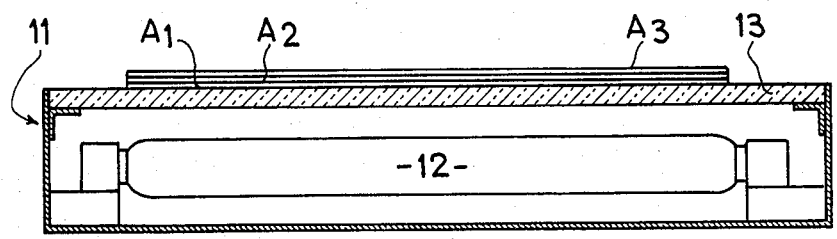
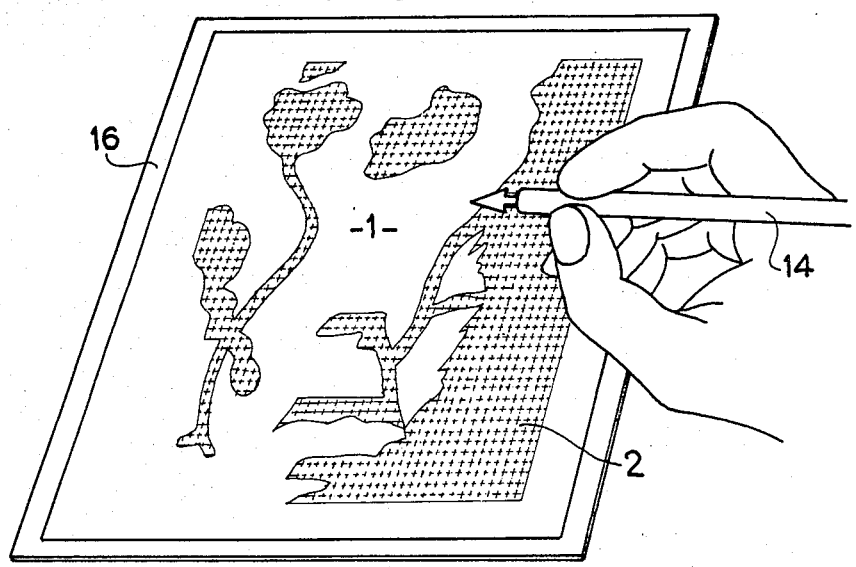

METHOD OF MAKING COLOR SEPARATION PLATES USED AS A PROOF AND A POSITIVE FOR MAKING OFFSET PRINTING PLATES PHOTOGRAPHICALLY

This is a continuation of application Ser. No. 031,938, filed Apr. 20, 1979, which is is a continuation of patent Ser. No. 783,748, filed Apr. 1, 1977, both now abandoned.

The invention relates to a gravure process for obtaining a translucent multi-colour image, in particular for colour printing.

In the graphic arts, it is common practice to compose translucent multi-colour images by cutting out coloured paper, assembling these cuttings by juxtaposition in accordance with a certain design and then inserting this design between two transparent sheets.

In colour printing it is moreover known to employ translucent monochrome supports for making proofs giving, by transparency, the image of the print that will be finally produced by the printing press, each of the translucent supports being constituted by a transparent support provided on one side with a layer of colouring matter. In each support, there is inscribed the image of a halftone positive corresponding to the colour of the support, so that the superimposition of the supports in a viewer corresponds to the print that the printing press will produce.

An object of the invention is to provide a process for making a translucent multi-colour picture which is radically different from the aforementioned known processes and which comprises preparing a plurality of translucent monochrome supports, each constituted by a transparent support provided on one side thereof with a layer of colouring matter, and making on each monochrome support an elementary design, corresponding to the final image, by a selective removal of the colouring matter with an engraving tool, which is a scraping or erasing tool, the multi-colour image resulting from the transparency of the superimposed engraved monochrome supports.

This process therefore provides an original means for graphic creation which, although akin to the technique of coloured paper cuttings, offers much wider possibilities in that, instead of being based on juxtaposed flat elements, also employed in stained glass work, it is based on the superimposition of colours and therefore permits infinite combinations to be obtained which render in particular possible the reproduction of natural colours with gradations. The invention provides the engraver artist with a palette which is as rich as that of painting if he is willing to apply himself to the technique of colour composition synthesis.

It will be understood that the monochrome supports may be made with colours which reproduce those of the inks currently employed in industrial colour printing.

The monochrome support is normally in the form of a sheet or flexible film, but this does not exclude the possibility of carrying out the engraving work on preformed rigid supports, for example for producing curved or spherical surfaces which lend themselves to special light effects.

Certain monochrome supports are commercially available, for example the films sold under the trademark TRANSPAREX by the firm AGFA-GEVAERT and films produced by the firm 3M under the name COLOUR KEY or TRANSFER KEY.

However, the engraver artist may himself produce the monochrome support from a transparent film by depositing on one side of this film a coloured coating, in the form of a powder or dye, possibly with the use of an adhesive, the colouring matter being applied by any means, for example an artist's paint-brush, a brush, silk-screen, printing roller, spray-gun, etc.

Tests carried out by the Applicant have revealed the particular advantage, for producing a monochrome support, of the sandwich produced by DU PONT DE NEMOURS under the trademark CROMALIN which comprises a transparent support of MYLAR on which there is applied in the viscous state a layer of ultraviolet-sensitive acrylic photopolymer, this viscous layer being protected by a sheet of polyethylene. To produce the layer of colouring matter, the propylene sheet is removed and there is deposited by means of an applicating pad or wad a layer of colouring matter in the form of a powder which, in penetrating the viscous matter, dries the latter and renders it relatively hard and stable. To complete the solidification of the layer, it may also be exposed to ultraviolet rays. The artist can now work on this layer with an engraving tool to make the desired pattern.

Irrespective of the nature of the monochrome support, the colouring mater can be worked on with the most diverse tools capable of removing the colouring matter selectively. For example, there may be employed:

A knife such as that sold in the U.S.A. under the trademark EXACTO or that sold in France under the trademark NT CUTTER.

An unsplit metal nib, for example a vaccino-style.

An electrically vibrated engraving tool.

Sandpaper or emery.

A grained roller or a rocker for mezzotint engraving.

A thermal stylus.

The colouring matter may also be removed for example by means of a brush, fabric, absorbent wad, felt etc. impregnated with an appropriate solvent which may be methylated spirits if the colouring matter is a powder, or "toner", of the firm DU PONT DE NEMOURS.

The process of the invention may be carried out not only by experienced artists or professionals, but also, in a pedagogical context, by children who, with simple means, may be initiated in artistic creation and receive a training which successfully complements that which is usually received in schools.

The process may also be employed in teaching establishments and laboratories as a means for the study of colour and light from the point of view of physics and chemistry.

As to colour printing, the invention is of exceptional interest since the individual engraved monochrome supports may be employed directly for producing—provided that conventional photo-mechanical operations are carried out—the typons from which the usual printing plates may be made, for example for the offset press or any other colour printing press.

Under certain conditions of opacity, the individual engraved monochrome supports can themselves be used to make the usual printing plates. In other words, the step of producing the typons could at times be eliminated.

The monochrome support according to the invention therefore performs the same function as a colour separation plate which, in present-day colour printing techniques, is obtained from a full-colour original under notoriously difficult conditions.

For three-colour printing, it is obviously necessary to engrave three monochrome supports whose colours are, respectively, red, yellow and blue. An additional support of black colour would also be required for four-colour printing.

The invention will be explained in the ensuing description with reference to the accompanying drawings in which:

FIG. 6 is a view of a modification of the sandwich;

FIG. 7 is a view of a stack of monochrome films on a light table;

FIG. 8 represents the scraping operation on a monochrome film for engraving an elementary design;

Figure 1:
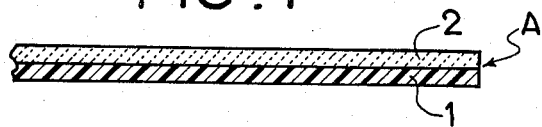
FIG. 1 is a sectional view of a monochrome film.

FIG. 1 is a sectional view of a monochrome film A for carrying out the process according to the invention. This film comprises a support 1 constituted by a sheet of transparent material on one of the sides of which there is applied a layer of a dry and translucent colouring matter 2. Such a monochrome film is commercially available in certain colour ranges, in particular under the two following names:

TRANSPAREX of the firm AGFA-GEVAERT which concerns a support of polyester acetate coated with a dry coloured emulsion based on coal tar, it being possible to employ the film directly for making typons;

COLOUR KEY of the firm MINNESOTA MINING MANUFACTURING COMPANY (3M) which concerns a polypropylene support coated with a dry coloured emulsion and constituting a light sensitive film.

Figure 2:
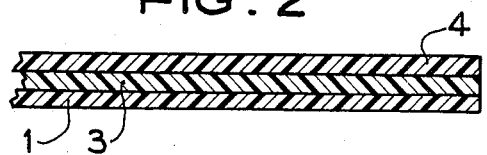
FIGS. 2, 3 and 4 represent the operations for preparing a monochrome film from a sandwich comprising a layer of viscous photopolymer.
Figure 3:
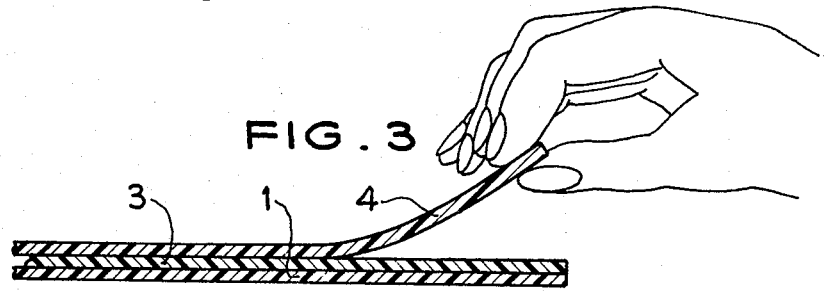
Figure 4:

FIG. 2 is a sectional view of a "CROMALIN OVERLAY" sandwich of the "Positive Lithofilm" type produced by the firm DU PONT DE NEMOURS from which a monochrome film A can be obtained. The sandwich comprises a support 1 of MYLAR (polyethyleneterephthalate) one of the sides of which carries a layer 3 of a viscous ultraviolet-sensitive acrylic photopolymer protected by a sheet of polypropylene 4. After this sheet has been removed (FIG. 3), a layer 6 of powdered colouring matter (toner) is spread uniformly over the uncovered surface of the layer 3 of photopolymer by means of an applicator pad. The fine particles of the pigmented powder penetrate the viscous photopolymer and dry it at least partly and impart thereto a certain hardness, sometimes sufficient for the photopolymer-powder mixture to constitute a dry homogeneous layer equivalent to the layer 2 shown in FIG. 1.

If the mixture is considered too viscous for the subsequent treatment, a dry layer 2 may be obtained by exposing the MYLAR-photopolymer-colouring matter mixture to ultraviolet light (FIG. 5) which hardens the photopolymer-colouring matter mixture and results in a film A.

Figure 5:
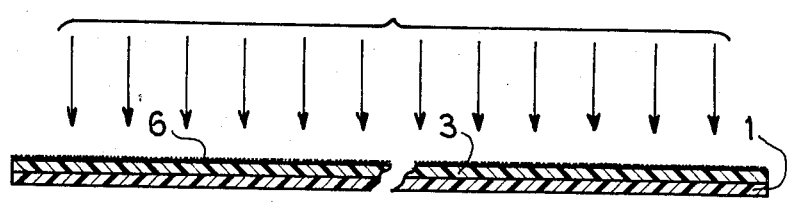
FIG. 5 represents the treatment of the monochrome film shown in FIG. 4 with ultraviolet rays.

FIG. 6 shows a sandwich of a slightly different nature from which a film A may also be produced. This sandwich, which is termed "TRANSFER KEY" and is sold by the firm 3M, consists of a transparent support 1 of acetate on which there is deposited a layer 7 of viscous coloured emulsion formed by a diazoic colourant, sensitive to ultraviolet rays, and protected by a sheet of paper 4. The film A is obtained after removal of the protective sheet 4, by exposing the coloured emulsion 7 to ultraviolet light as shown in FIG. 5 so that it becomes dry and relatively hard.

For the engraving of the monochrome films A, a conventional light table is used (FIG. 7) comprising a frame 11 in which a source of light 12 illuminates a translucent glass 13 flat against which there is placed a monochrome film A or a stack of films $A_1$, $A_2$, $A_3$.

FIG. 8 shows the engraving operation proper consisting in working on the layer of colourant 2 of a film A with a scraping tool 14 such as, for example, a vaccinostyle so as to remove by scraping in selected regions the colour adhering to the support 1 and for an elementary design. In the course of this work, the film A is normally placed in contact with the translucent glass 13 of the light table with or without interposition of a transparent sketch 16 on which there is drawn the pattern serving as the model or guide for the operator.

As it concerns the production finally of a multicolour image by superimposition of a plurality of engraved monochrome films, for example three films ($A_1$, $A_2$, $A_3$), it is possible first to produce roughly each one of the elementary designs by disposing them separately on the light table, possibly with the aid of a sketch proper to each film, and then to proceed to the finishing of each elementary design by placing the corresponding film on the table, above the other two and in register with them, so that the artist has constantly visible before him the image of synthesis resulting from the superimposition of the three films the engraving of which he achieves by successive working and retouching.

Figure 9:
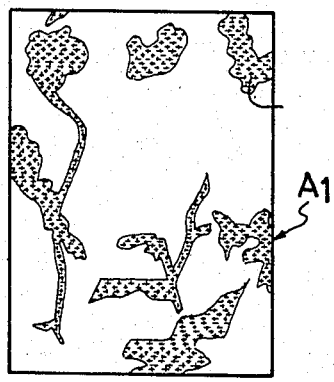
FIGS. 9, 10 and 11 represent three engraved monochrome films of yellow, red and blue colour respectively.
Figure 10:
Figure 11:
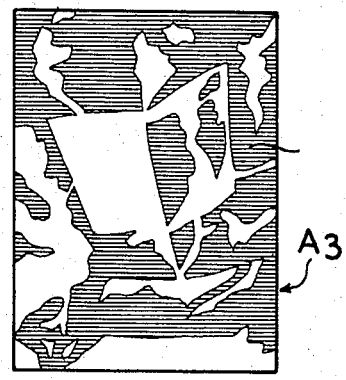
Figure 12:
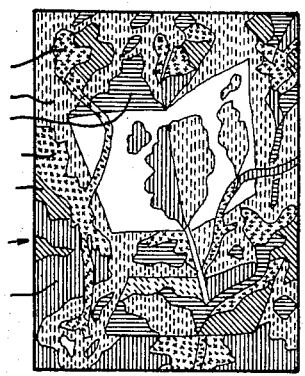
FIG. 12 represents the image resulting from the superimposition of the films shown in FIGS. 9, 10 and 11.

FIGS. 9, 10 and 11 show symbolically three films $A_1$, $A_2$, $A_3$ respectively yellow, red and blue in colour in each one of which there has been engraved an elementary design by a scraping operation. The superimposition of the three engraved films in register gives, by transparency, the multi-colour image of synthesis B shown symbolically in FIG. 12. This image is also in conformity with the printing on paper which would be obtained in a three-colour printing press, for example of the OFFSET type, whose three work cylinders are designated for yellow, red and blue ink respectively, and are provided with printing plates reproducing the typons produced by conventional photomechanical operations from the engraved films $A_1$, $A_2$, $A_3$ of the FIGS. 9 to 11. For four-colour printing, a fourth engraved film in black would obviously be necessary.

Figure 13:
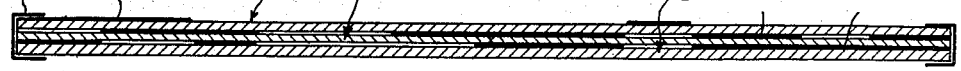
FIG. 13 is a sectional view of an assembly of these films.

FIG. 13 shows three films $A_1$, $A_2$, $A_3$ which are assembled in register in a suitable frame 17 so as to constitute a translucent multi-colour image which may be used in the manner of stained glass.

Many changes or additions could, of course, be made to the engraving process described hereinbefore.

Thus, a monochrome film A could be obtained directly by the operator by application on a transparent support sheet 1 of an adhesive in which there would be subsequently incorporated a powdered pigment to constitute the layer 2 of colouring matter.

Likewise, the scraping tool 14 (FIG. 8) could be of a form different from that illustrated. It may also be replaced by an erasing tool employing for example a material impregnated with a solvent of the colouring matter 2, or alternatively by a thermal stylus.

In FIG. 8 it has been assumed that the operator holds the engraving tool 14 directly. However, this tool could be carried by a device controlled in such manner as to constrain the tool to carry out the engraving work. Such a device could be constructed in the form of a pantograph comprising a follower element which would follow a model (for example the pantograph made in U.S.A. under the name LEROY PEN) and would be guided by hand or would be made to follow the model by optical, electrical or electronic means. The device could be controlled by electric signals produced for example by a computer.

Having now described my invention what I claim as new and desire to secure by Letters Patent is:

1. A method of making color separation plates used as a proof and a positive from which offset printing plates are directly made photographically comprising, creating an original art image as full color line art on a monochrome overlay by superimposing in an overlay arrangement a plurality of individual transparent supports each having a continuous color layer of coloring material on a major side surface and the coloring material of the coloring material of the individual layers of the monochrome supports each being a different color corresponding to the color of a printing ink, mechanically removing coloring material on each support sequentially while maintaining the monochrome supports superimposed to define thereon an elementary design for progressively jointly defining with the individual monochrome supports superimposed with elementary designs thereon in a registry effective to define a final original art image in a desired color for each portion of said original art image, while removing said coloring material continuously comparing the elementary design of the individual monochrome supports superimposed with elementary designs thereon in a registry effective to define a final original art image in a desired color for each portion of said original art image, while removing said coloring material continuously comparing the elementary design of the individual monochrome supports superimposed so that the complete original art image defined by the superimposed monochrome supports is revised as the elementary design on given support is changed, and maintaining the monochrome supports superimposed to obtain a multicolor final original art image by transparency.

2. A method of making color separation plates used as a proof and a positive form which offset printing plates are directly made photographically according to claim 1, comprising adding coloring material of a given color on each transparent support prior to the removal thereof.

3. A method of making color separation plates used as a proof and a positive from which offset printing plates are directly made photographically according to claim 1, in which said mechanical removing matter is effected normally with a tool.

* * * * *